United States Patent
Kim et al.

(10) Patent No.: US 6,944,069 B2
(45) Date of Patent: Sep. 13, 2005

(54) SEMICONDUCTOR MEMORY DEVICE HAVING COLUMN SELECT LINE DRIVING SCHEME FOR REDUCING SKEW BETWEEN COLUMN SELECT LINES AND COLUMN SELECT LINE DRIVING METHOD THEREOF

(75) Inventors: Byung-chul Kim, Suwon (KR); Seung-bum Ko, Suwon (KR)

(73) Assignee: Samsung Electronics Co., Ltd. (KR)

( * ) Notice: Subject to any disclaimer, the term of this patent is extended or adjusted under 35 U.S.C. 154(b) by 1 day.

(21) Appl. No.: 10/803,845

(22) Filed: Mar. 18, 2004

(65) Prior Publication Data

US 2004/0202029 A1 Oct. 14, 2004

(30) Foreign Application Priority Data

Apr. 10, 2003 (KR) ................................ 10-2003-0022571

(51) Int. Cl.[7] ................................................. G11C 7/00
(52) U.S. Cl. ................... 365/191; 365/194; 365/230.06; 365/230.08
(58) Field of Search .................................. 365/191, 194, 365/230.06, 230.08

(56) References Cited

U.S. PATENT DOCUMENTS 6,163,498 A   12/2000 Moon ................... 365/230.06

6,359,828 B1 * 3/2002 La ......................... 365/230.06

FOREIGN PATENT DOCUMENTS

KR  10-0200766  3/1999  ......... G11C/11/407
KR  10-0311038  9/2001  ......... G11C/11/407

* cited by examiner

*Primary Examiner*—Anh Phung
*Assistant Examiner*—Pho M. Luu
(74) *Attorney, Agent, or Firm*—Mills & Onello LLP

(57) ABSTRACT

Provided are a semiconductor memory device with a column select line (CSL) driving scheme capable of reducing skew between column select lines, and a CSL driving method. The semiconductor memory device includes a plurality of CSL enable controllers and a plurality of CSL disable controllers that are installed around corresponding CSL drivers, thereby making loads on input terminals of the CSL drivers almost the same and reducing enable and disable skew between the CSLs. The semiconductor memory device includes a plurality of enable master signal delayers that delay a signal output from a CSL enable master signal generator for different times so as to generate different delay signals and transmit the delay signals to the plurality of CSL enable controllers, and a plurality of disable master signal delayers that delay a signal output from a CSL disable master signal generator for different times so as to generate different delay signals and transmit the delay signals to the plurality of CSL disable controllers. It is possible to compensate for signal delay caused by different loads on signal transmission lines and further reduce enable and disable skew between the CSLs.

8 Claims, 7 Drawing Sheets

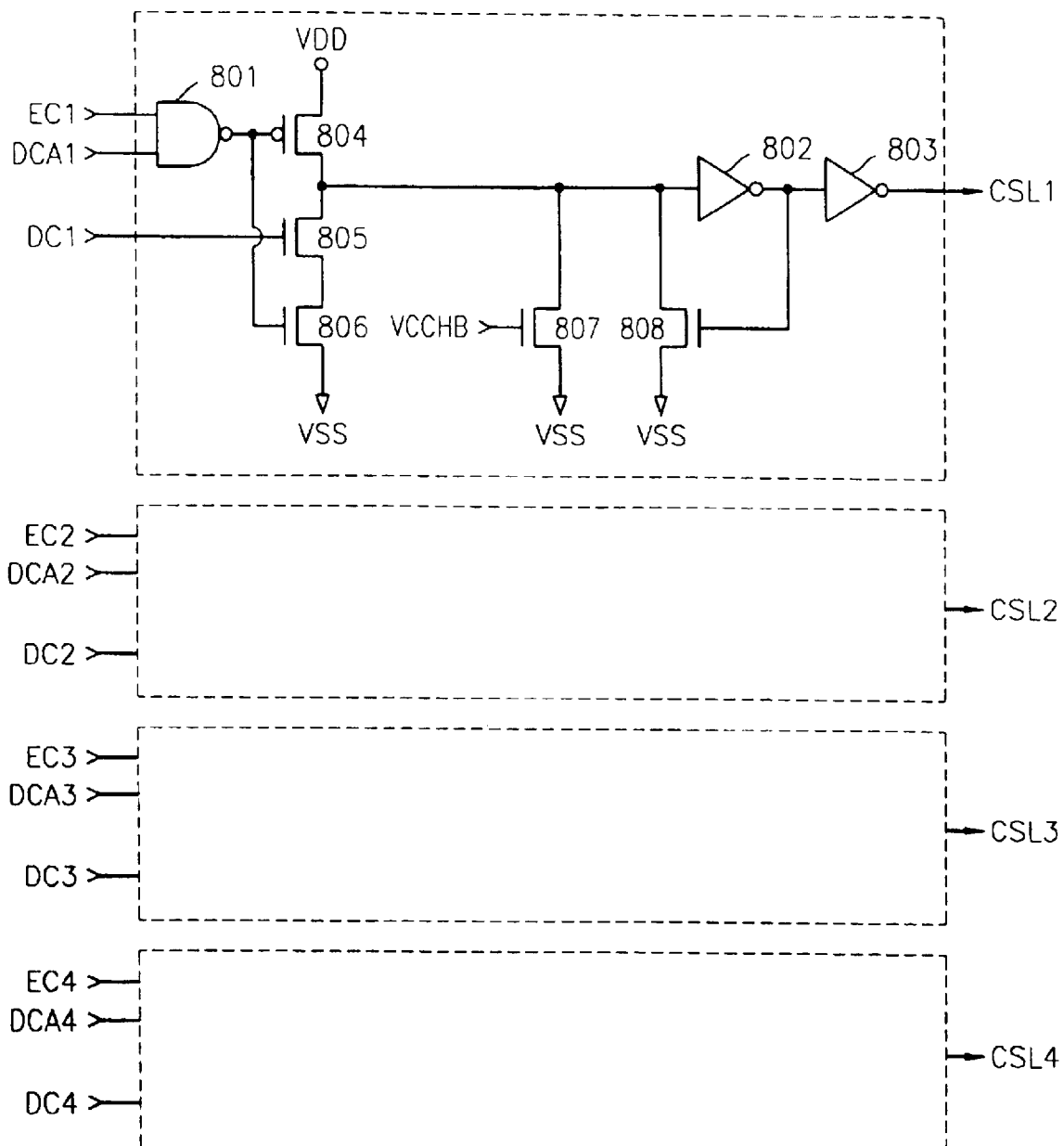

SEMICONDUCTOR MEMORY DEVICE HAVING COLUMN SELECT LINE DRIVING SCHEME FOR REDUCING SKEW BETWEEN COLUMN SELECT LINES AND COLUMN SELECT LINE DRIVING METHOD THEREOF

BACKGROUND OF THE INVENTION

This application claims the priority of Korean Patent Application No. 2003-22571, filed on Apr. 10, 2003, in the Korean Intellectual Property Office, the disclosure of which is incorporated herein in its entirety by reference.

1. Field of the Invention

The present invention relates to a semiconductor memory device, and more particularly, to a semiconductor memory device capable of reducing skew between column select lines (CSLs) and a CSL driving method.

2. Description of the Related Art

In dynamic random access memory (DRAM), an external address is decoded to generate a column address, and column select lines (CSLs) for memory cells are selected using the column address. Thus, it is important to reduce skew between the CSLs during selection of the CSLs so as to improve write and read operation speeds.

FIG. 1 is a block diagram illustrating a structure of a conventional semiconductor memory device with a CSL driving scheme. Referring to FIG. 1, a CSL enable master signal generator A11 receives an internal clock PCLKC and generates a CSL enable master signal EM, and a CSL disable master signal generator B11 receives the internal clock PCLKC and generates a CSL disable master signal DM. The internal clock PCLKC is generated from an external clock applied from outside the semiconductor memory device.

Next, a CSL enable controller E11 generates a CSL enable control signal EC in response to the CSL enable master signal EM and a CSL disable controller F11 generates a CSL disable control signal DC in response to the CSL disable master signal DM.

Next, a plurality of CSL drivers G11 through G14 drive CSLs CSL1 through CSL4 of a plurality of memory cell arrays H11 through M14, respectively, in response to a decoded column address (not shown), the CSL enable control signal EC, and the CSL disable control signal DC.

The conventional CSL driving scheme uses one CSL enable controller E11 and one CSL disable controller F11 so as to control all of the CSL drivers G11 through G14. As a result, a line for transmitting the signal EC output from the CSL enable controller and a line for transmitting the signal DC output from the CSL disable controller F11 are globally routed to all of the CSL drivers G11 through G14.

Accordingly, the loads on input terminals of the CSL drivers G11 through G14 depend on the positions of the memory cell arrays H11 through H14 and the CSL drivers G11 through G14. An increase in the load increases skew between the CSLs CSL1 through CSL4. This phenomenon places restrictions on improvement of write and read operation speeds of the semiconductor memory device.

SUMMARY OF THE INVENTION

The present invention provides a semiconductor memory device with a column select line (CSL) driving scheme capable of reducing skew between CSLs.

The present invention also provides a method of driving CSLs of a semiconductor memory device so as to reduce skew between the CSLs.

According to an aspect of the present invention, there is provided a semiconductor memory device comprising a plurality of memory cell arrays; an enable master signal generator which receives a predetermined signal and generates a column select line enable master signal; a disable master signal generator which receives the predetermined signal and generates a column select line disable master signal; a plurality of enable master signal delayers which delay the column select line enable master signal; a plurality of disable master signal delayers which delay the column select line disable master signal; a plurality of column select line enable controllers which generate column select line enable control signals, respectively, in response to signals output from the enable master signal delayers; a plurality of column select line disable controllers which generate column select line disable control signals, respectively, in response to signals output from the disable master signal delayers; and a plurality of column select line drivers which drive column select lines of the related memory cell arrays, respectively, in response to signals output from the column select line enable controllers and signals output from the column select line disable controllers.

In particular, the plurality of CSL enable controllers and the plurality of CSL disable controllers are installed around the CSL drivers. Signal delay times delayed by the enable master signal delayers can be different from one another, and signal delay times delayed by the disable master signal delayers can be different from one another. In one embodiment, the predetermined signal is an internal clock generated from an external clock that is applied from the outside of the semiconductor memory device.

In one embodiment, the column select line enable controllers respond to a decoded column address. In one embodiment, the column delect line disable controllers respond to a decoded column address.

According to another aspect of the present invention, there is provided a method of driving column select lines of a semiconductor memory device with a plurality of memory cell arrays, the method comprising receiving a predetermined signal and generating a column select line enable master signal; receiving the predetermined signal and generating a column select line disable master signal; generating a plurality of delayed column select line enable master signals by delaying the column select line enable master signal for different times; generating a plurality of delayed column select line disable master signals by delaying the column select line disable master signal for different times; generating a plurality of column select line enable control signals in response to the delayed column select line enable master signals; generating a plurality of column select line disable control signals in response to the delayed column select line disable master signals; and driving the column select lines of the memory cell arrays in response to the column select line enable control signals and the column select line disable control signals, respectively.

In one embodiment, the predetermined signal is an internal clock generated from an external clock applied from the outside of the semiconductor memory device.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIG. 8 illustrates detailed circuit constructions of a plurality of CSL drivers of FIG. 2.

DETAILED DESCRIPTION OF THE INVENTION

Figure 2:
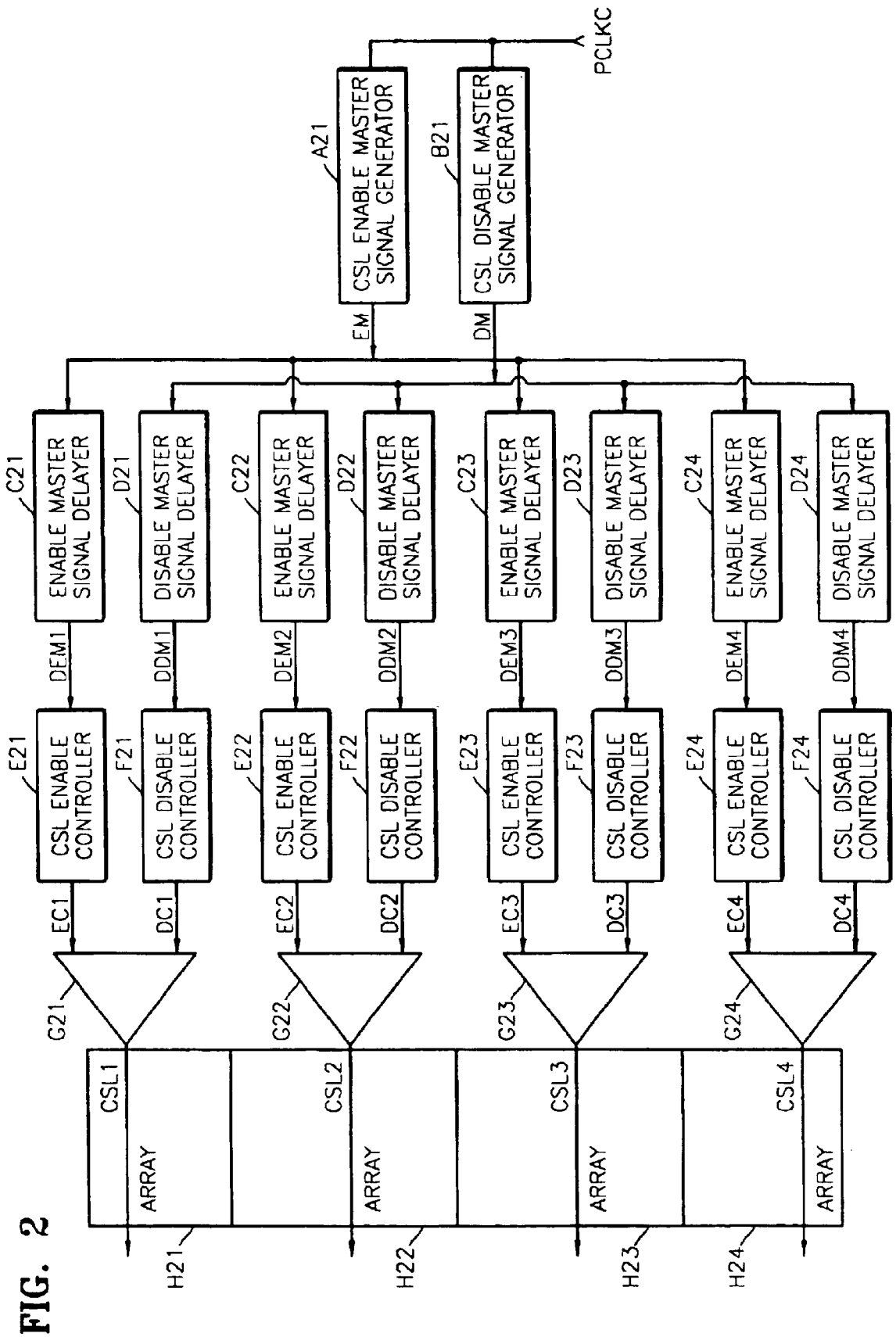
FIG. 2 illustrates a structure of a semiconductor memory device according to a preferred embodiment of the present invention.

FIG. 2 illustrates a semiconductor memory device according to a preferred embodiment of the present invention. The semiconductor memory device of FIG. 2 operates according to a column select line (CSL) driving method according to the present invention. Referring to FIG. 2, the semiconductor memory device according to a preferred embodiment of the present invention includes a plurality of memory cell arrays H21 through H24, a CSL enable master signal generator A21, a CSL disable master signal generator B21, a plurality of enable master signal delayers C21 through C24, a plurality of disable master signal delayers D21 through D24, a plurality of CSL enable controllers E21 through E24, a plurality of CSL disable controllers F21 through F24, and a plurality of CSL drivers G21 through G24.

Figure 1:
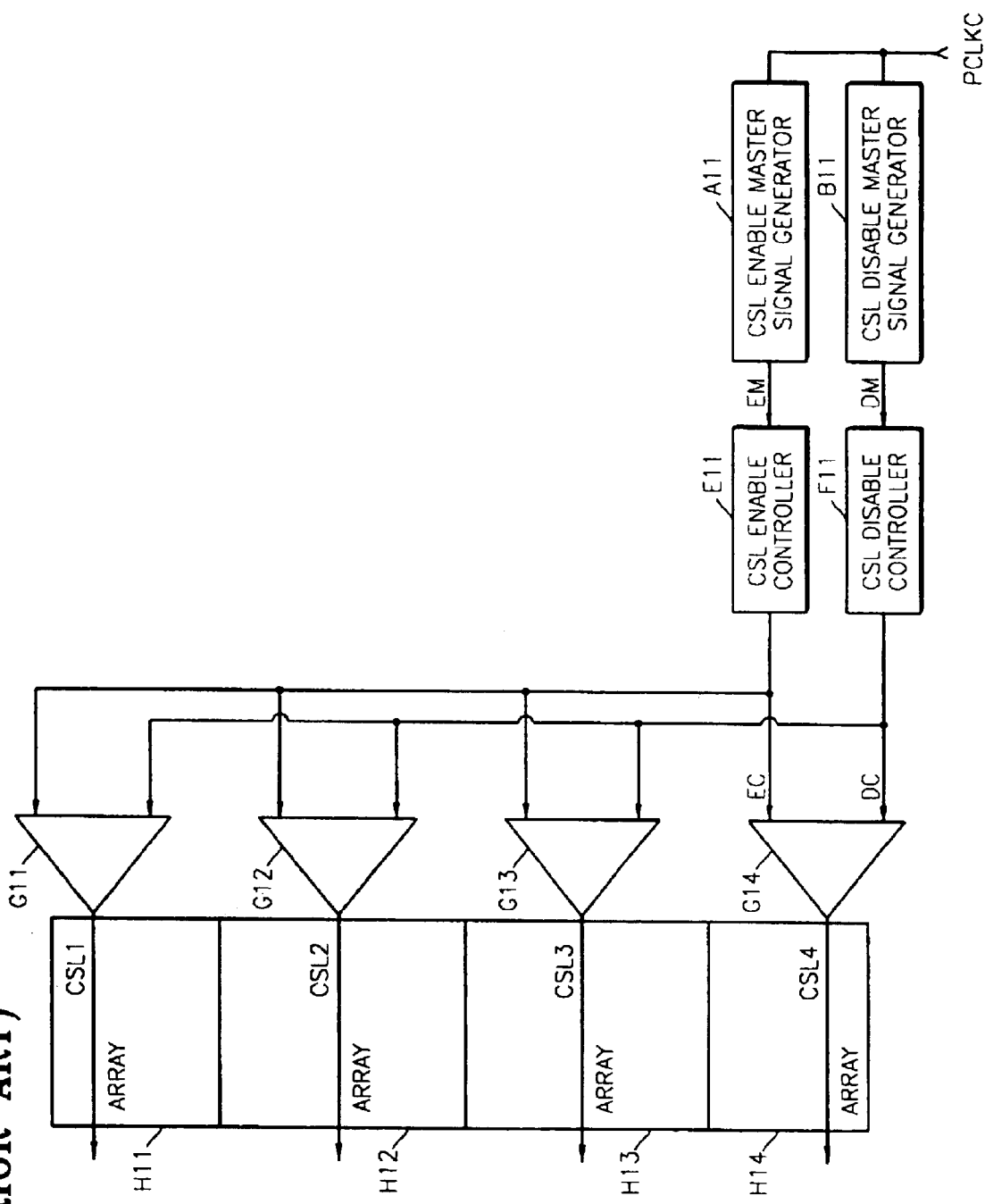
FIG. 1 is a block diagram illustrating a structure of a conventional semiconductor memory device with a column select line (CSL) driving scheme.

Unlike the conventional semiconductor memory device of FIG. 1, the semiconductor memory device according to the present invention includes the plurality of CSL enable controllers E21 through E24 and the plurality of CSL disable controllers F21 through F24 installed in proximity to CSL drivers G21 through G24. Also, a plurality of enable master signal delayers C21 through C24 are installed between the plurality of CSL enable controllers E21 through E24 and the CSL enable master signal generator A21. The plurality of disable master signal delayers D21 through D24 are installed between the plurality of CSL disable controllers F21 through F24 and the CSL disable master signal generator B21.

The CSL enable master signal generator A21 receives an internal clock PCLKC and generates a CSL enable master signal EM. The CSL disable master signal generator B21 receives the internal clock PCLKC and generates a CSL disable master signal DM. The internal clock PCLKC is made from an external clock applied from the outside of the semiconductor memory device.

The plurality of enable master signal delayers C21 through C24 delay the CSL enable master signal EM for different times to generate a plurality of delayed CSL enable master signals DEM1 through DEM4, respectively. The plurality of disable master signal delayers D21 through D24 delay the CSL disable master signal DM for different times to generate a plurality of delayed CSL disable master signals DDM1 through DDM4, respectively.

The plurality of CSL enable controllers E21 through E24 generates a plurality of CSL enable control signals EC1 through EC4 in response to the plurality of delayed CSL enable master signals DEM1 through DEM4 and a decoded column address (not shown). The plurality of CSL disable controllers F21 through F24 generates a plurality of CSL disable control signals DC1 through DC4 in response to the plurality of delayed CSL disable master signals DDM1 through DDM4 and a decoded column address (not shown).

The plurality of the CSL drivers G21 through G24 drive the memory cell arrays H21 through H24 in response to the CSL enable control signals EC1 through EC4 and the CSL disable control signals DC1 through DC4, respectively.

Figure 3:
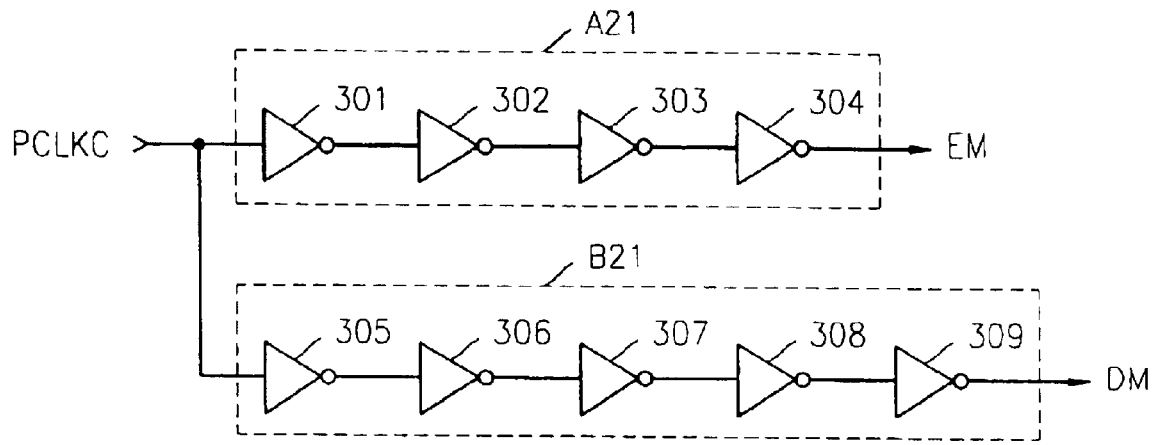
FIG. 3 illustrates detailed circuit constructions of a CSL enable master signal generator and a CSL disable master signal generator shown in FIG. 2.

FIG. 3 shows detailed circuit diagrams of the CSL enable master signal generator A21 and the CSL disable master signal generator B21 of FIG. 2. Referring to FIG. 3, the CSL enable master signal generator A21 includes an even number of inverters 301 through 304 that are connected in series. The CSL enable master signal generator A21 is a kind of delayer that delays the internal clock PCLKC for a predetermined time to generate the CSL enable master signal EM.

The CSL disable master signal generator B21 includes an odd number of inverters 305 through 309 that are connected in series. The CSL disable master signal generator B21 is a kind of inverting delayer that inverts the internal clock PCLKC and delays it for a predetermined time in order to obtain the CSL disable master signal DM.

Figure 4:
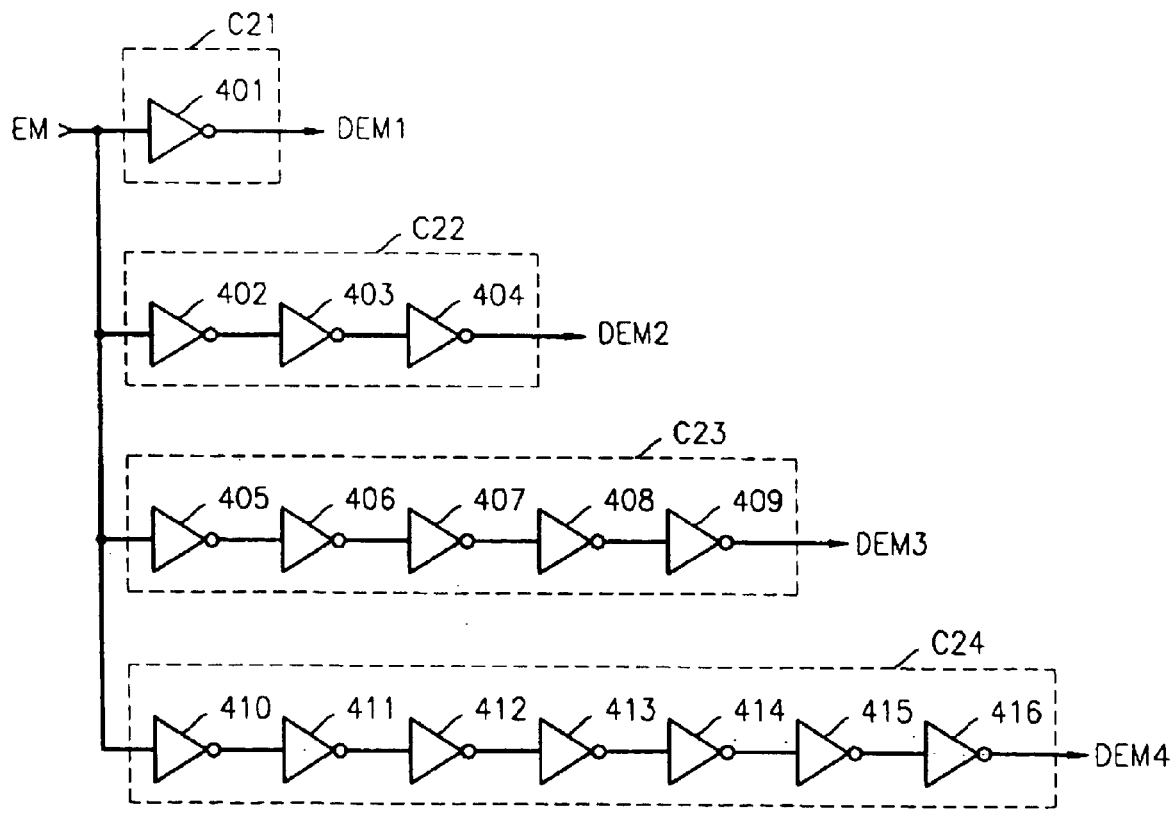
FIG. 4 illustrates detailed circuit constructions of a plurality of enable master signal delayers of FIG. 2.

FIG. 4 illustrates circuit diagrams of the plurality of the enable master signal delayers C21 through C24. Referring to FIG. 4, the enable master signal delayer C21 includes an inverter 401 and the enable master signal delayer C22 includes three inverters 402 through 404. The enable master signal delayer C23 includes five inverters 405 through 409 and the enable master signal delayer C24 includes seven inverters 410 through 416. The reason for setting the enable master signal delayers C21 through C24 to have different total numbers of inverters is to make these delayers delay the CSL enable master signal EM for different times. Thus, the number of inverters included in each enable master signal delayer is not limited.

Figure 5:
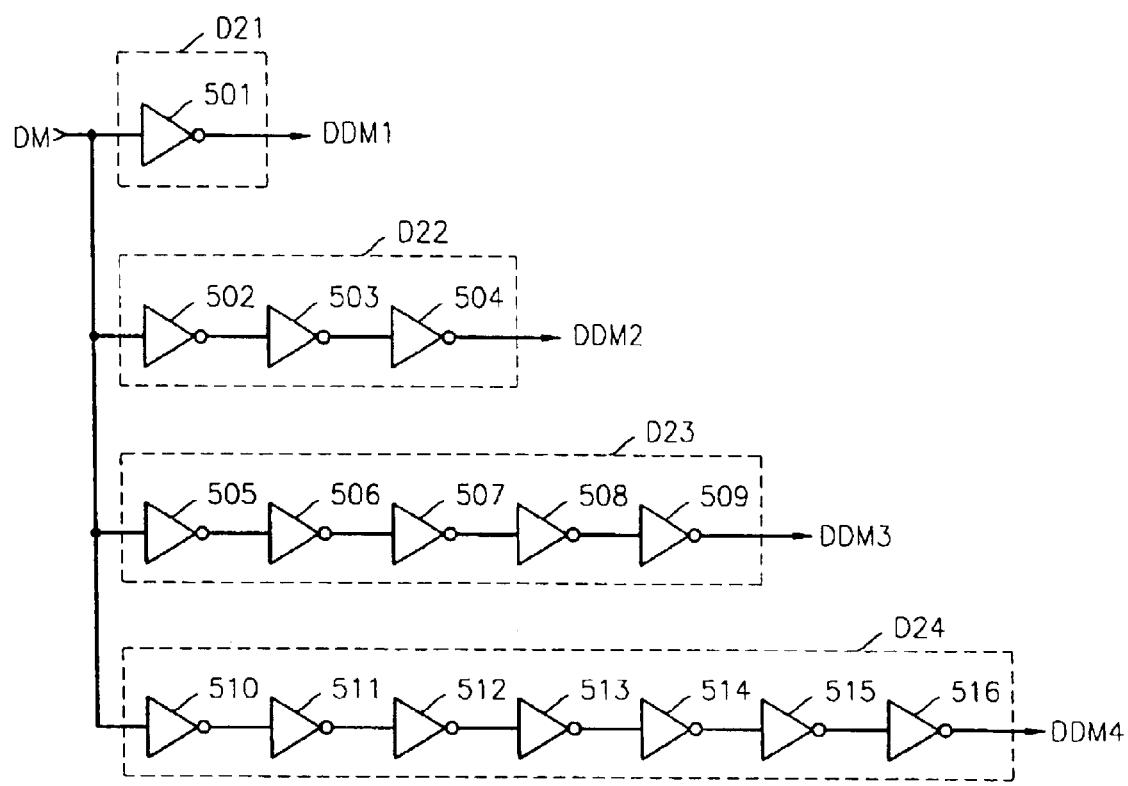
FIG. 5 illustrates detailed circuit constructions of a plurality of disable master signal delayers of FIG. 2.

FIG. 5 illustrates circuit diagrams of the plurality of the disable master signal delayers D21 through D24 of FIG. 2. Referring to FIG. 5, the disable master signal delayer D21 includes an inverter 501 and the disable master signal delayer D22 includes three inverters 502 through 504. The disable master signal delayer D23 includes five inverters 505 through 509 and the disable master signal delayer D24 includes seven inverters 510 through 516. Likewise, the total number of inverters included in each disable master signal delayer is not limited.

Figure 6:
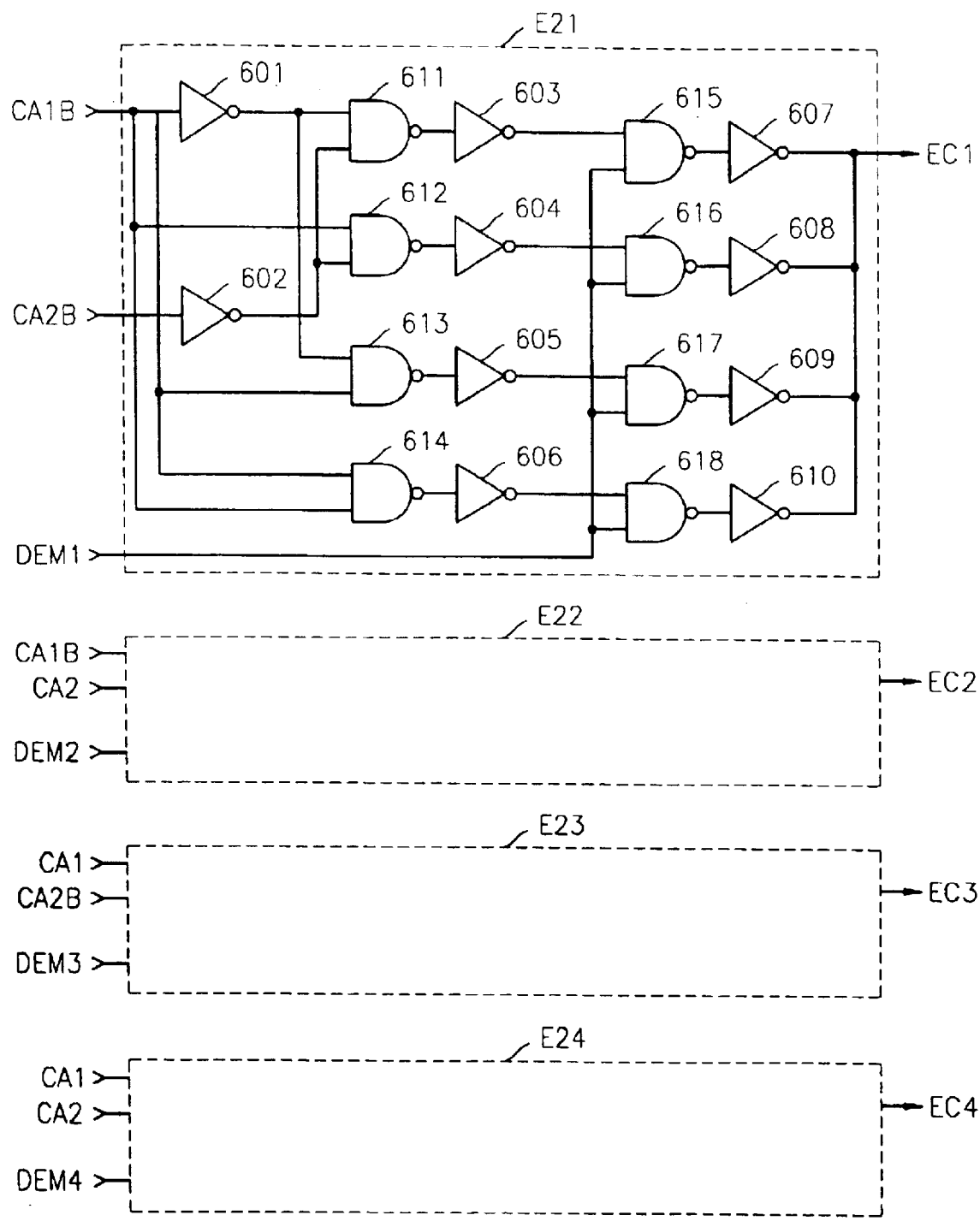
FIG. 6 illustrates detailed circuit constructions of a plurality of CSL enable controllers of FIG. 2.

FIG. 6 illustrates circuit diagrams of the plurality CSL enable controllers E21 through E24. Referring to FIG. 6, each of the CSL enable controllers E21 through E24 includes inverters 601 through 610 and NAND gates 611 through 618.

The CSL enable controller E21 is activated when the delayed CSL enable master signal DEM1 is at logic "high" and generates the CSL enable control signal EC1 in response to decoded column addresses CA1B and CA2B. The CSL enable controller E22 is activated when the delayed CSL enable master signal DEM2 is at logic "high" and generates the CSL enable control signal EC2 in response to the decoded column addresses CA1B and CA2.

The CSL enable controller E23 is activated when the delayed CSL enable master signal DEM3 is at logic "high" and generates the CSL enable control signal EC3 in response to the decoded column addresses CA1B and CA2. The CSL enable controller E24 is activated when the delayed CSL enable master signal DEM4 is at logic "high" and generates the CSL enable control signal EC4 in response to the decoded column addresses CA1B and CA2.

Figure 7:
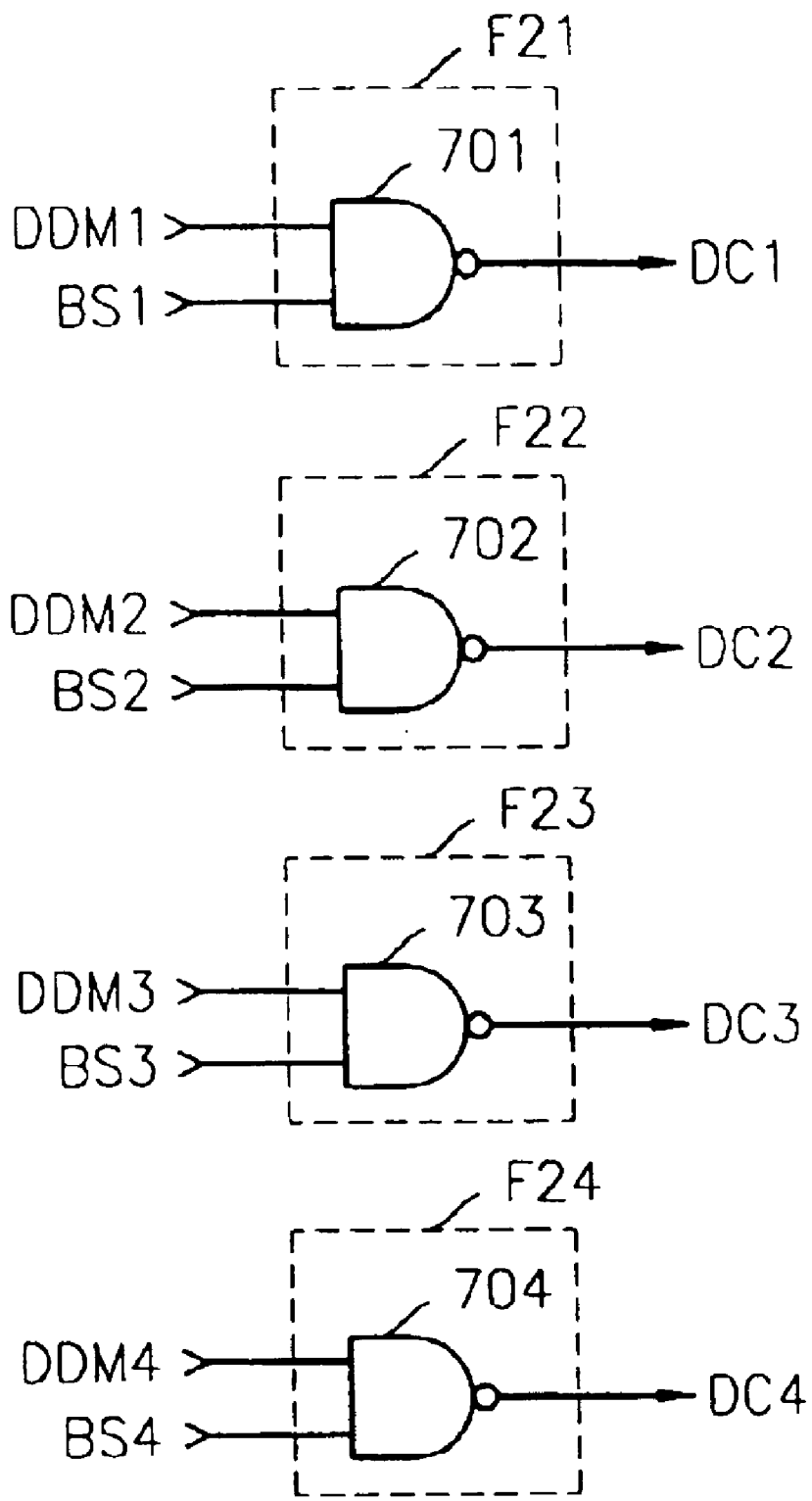
FIG. 7 illustrates detailed circuit constructions of a plurality of CSL disable controllers of FIG. 2.

FIG. 7 illustrates circuit diagrams of the plurality of CSL disable controllers F21 through F24. As shown in FIG. 7, each of the CSL disable controllers F21 through F24 includes a NAND gate 701, 702, 703, and 704, respectively.

The CSL disable controller F21 NANDs the delayed CSL disable master signal DDM1 and a decoded column address, i.e., a bank select signal BS1, to generate the CSL disable control signal DC1. The CSL disable controller F22 NANDs the delayed CSL disable master signal DDM2 and a bank select signal BS2 to generate the CSL disable control signal DC2.

The CSL disable controller F23 NANDs the delayed CSL disable master signal DDM3 and a bank select signal BS3 to generate the CSL disable control signal DC3. The CSL disable controller F24 NANDs the delayed CSL disable master signal DDM4 and a bank select signal BS4 to generate the CSL disable control signal DC4.

FIG. 8 illustrates circuit diagrams of the plurality of the CSL drivers G21 through G24. Referring to FIG. 8, each of the CSL drivers G21 through G24 includes a NAND gate 801, inverters 802 and 803, a PMOS transistor 804, and NMOS transistors 805 through 808.

The CSL driver G21 enables the CSL CSL1 to logic "high" when the CSL enable control signal EC1 is at logic "high" and the CSL disable control signal DC1 is at logic "low", and disables the CSL CSL1 to logic "low" when the CSL enable control signal EC1 is at logic "low" and the CSL disable control signal DC1 is at logic "high". The CSL driver G22 enables the CSL CSL2 to logic "high" when the CSL enable control signal EC2 is at logic "high" and the CSL disable control signal DC2 is at logic "low" and disables the CSL CSL2 to logic "low" when the CSL enable control signal EC2 is at logic "low" and the CSL disable control signal DC2 is at logic "high".

The CSL driver G23 enables the CSL CSL3 to logic "high" when the CSL enable control signal EC3 is at logic "high" and the CSL disable control signal DC3 is at logic "low", and disables the CSL CSL3 to logic "low" when the CSL enable control signal EC3 is at logic "low" and the CSL disable control signal DC3 is at logic "high". The CSL driver G24 enables the CSL CSL4 to logic "high" when the CSL enable control signal EC4 is at logic "high" and the CSL disable control signal DC4 is at logic "low" and disables the CSL CSL4 to logic "low" when the CSL enable control signal EC4 is at logic "low" and the CSL disable control signal DC4 is at logic "high".

As described above, unlike the conventional semiconductor memory device, a semiconductor memory device according to the present invention includes the plurality of CSL enable controllers E21 through E24 and the plurality of CSL disable controllers F21 through F24 installed around the CSL drivers G21 through G24. Accordingly, loads on input terminals of the CSL drivers G21 through G24 can be almost the same, thereby reducing enable and disable skews between the CSLs CSL1 through CSL4.

Also, the semiconductor memory device according to the present invention includes the plurality of the enable master signal delayers C21 through C24 between the plurality of CSL enable controllers E21 through E24 and the CSL enable master signal generator A21. In particular, since signal delay times delayed by the enable master signal delayers C21 through C24 are set differently, it is possible to compensate for signal delay caused by different loads on signal transmission lines, of a high-integration memory device, which are used for transmitting the CSL enable master signal EM and the delayed CSL enable master signals DEM1 through DEM4. Accordingly, enable skew between the CSLs CSL1 through CSL4 can be reduced.

Also, the semiconductor memory device according to the present invention includes the plurality of disable master signal delayers D21 through D24 between the plurality of CSL disable controllers F21 through F24 and the CSL disable master signal generator B21. Similarly, since signal delay times delayed by the disable master signal delayers D21 through D24 are set differently, it is possible to compensate for signal delay caused by different loads on signal transmission lines, of a high-integration memory device, for transmitting the CSL disable master signal DM and the delayed CSL disable master signals DDM1 through DDM4. Thus, enable skew between the CSLs CSL1 through CSL4 can be reduced.

Accordingly, during a read operation, it is possible to spend the same amount of time to sense data in the respective memory cell arrays H21 through H24, using input/output lines, regardless of the positions of the memory cell arrays H21 through H24. As a result, it is possible to minimize skew caused by data sensing and improving write operation speed of the semiconductor memory device. Further, during a write operation, it is possible to make points of time when a CSL is enabled and disabled the same regardless of the positions of the memory cell arrays H21 through H24, thereby improving a write operation speed.

As described above, a semiconductor memory device according to the present invention improves read and write operation speeds by reducing skew between CSLs.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device comprising:
   a plurality of memory cell arrays;
   an enable master signal generator which receives a predetermined signal and generates a column select line enable master signal;
   a disable master signal generator which receives the predetermined signal and generates a column select line disable master signal;
   a plurality of enable master signal delayers which delay the column select line enable master signal;
   a plurality of disable master signal delayers which delay the column select line disable master signal;
   a plurality of column select line enable controllers which generate column select line enable control signals, respectively, in response to signals output from the enable master signal delayers;
   a plurality of column select line disable controllers which generate column select line disable control signals, respectively, in response to signals output from the disable master signal delayers; and a plurality of column select line drivers which drive column select lines of the related memory cell arrays, respectively, in response to signals output from the column select line enable controllers and signals output from the column select line disable controllers.

2. The semiconductor memory device of claim 1, wherein signal delay times delayed by the enable master signal delayers are different from one another.

3. The semiconductor memory device of claim 1, wherein signal delay times delayed by the disable master signal delayers are different from one another.

4. The semiconductor memory device of claim 1, wherein the predetermined signal is an internal clock generated from an external clock that is applied from the outside of the semiconductor memory device.

5. The semiconductor memory device of claim 1, wherein the column select line enable controllers respond to a decoded column address.

6. The semiconductor memory device of claim 1, wherein the column select line disable controllers respond to a decoded column address.

7. A method of driving column select lines of a semiconductor memory device with a plurality of memory cell arrays, the method comprising:

receiving a predetermined signal and generating a column select line enable master signal;

receiving the predetermined signal and generating a column select line disable master signal;

generating a plurality of delayed column select line enable master signals by delaying the column select line enable master signal for different times;

generating a plurality of delayed column select line disable master signals by delaying the column select line disable master signal for different times;

generating a plurality of column select line enable control signals in response to the delayed column select line enable master signals;

generating a plurality of column select line disable control signals in response to the delayed column select line disable master signals; and driving the column select lines of the memory cell arrays in response to the column select line enable control signals and the column select line disable control signals, respectively.

8. The method of claim 7, wherein the predetermined signal is an internal clock generated from an external clock applied from the outside of the semiconductor memory device.

* * * * *